US011477412B2

(12) United States Patent
Bianco et al.

(10) Patent No.: US 11,477,412 B2
(45) Date of Patent: Oct. 18, 2022

(54) SYSTEM, METHOD, AND COMPUTER-ACCESSIBLE MEDIUM FOR REMOTE SENSING OF THE ELECTRICAL DISTRIBUTION GRID WITH HYPERTEMPORAL IMAGING

(71) Applicant: New York University, New York, NY (US)

(72) Inventors: Federica B. Bianco, New York, NY (US); Gregory G. Dobler, New York, NY (US); Steven E. Koonin, Cold Spring, NY (US)

(73) Assignee: NEW YORK UNIVERSITY, New York, NY (US)

( * ) Notice: Subject to any disclaimer, the term of this patent is extended or adjusted under 35 U.S.C. 154(b) by 0 days.

(21) Appl. No.: 16/581,966

(22) Filed: Sep. 25, 2019

(65) Prior Publication Data
US 2020/0099886 A1   Mar. 26, 2020

Related U.S. Application Data

(60) Provisional application No. 62/736,061, filed on Sep. 25, 2018.

(51) Int. Cl.
| | |
|---|---|
| *H04N 7/01* | (2006.01) |
| *G06T 5/00* | (2006.01) |
| *G06T 5/20* | (2006.01) |
| *G06T 5/10* | (2006.01) |
| *G06T 7/33* | (2017.01) |

(52) U.S. Cl.
CPC ........... *H04N 7/0132* (2013.01); *G06T 5/002* (2013.01); *G06T 5/10* (2013.01); *G06T 5/20* (2013.01); *G06T 7/33* (2017.01)

(58) Field of Classification Search
CPC ......... H04N 7/0132; G06T 7/33; G06T 5/002; G06T 5/10; G06T 5/20; G01R 19/2513
See application file for complete search history.

(56) References Cited

U.S. PATENT DOCUMENTS

| | | | |
|---|---|---|---|
| 7,427,815 B1 * | 9/2008 | Ye .............................. | H02J 3/38 |
| | | | 307/127 |
| 10,623,712 B2 * | 4/2020 | Wu ....................... | H04N 9/8205 |
| 2012/0002074 A1 * | 1/2012 | Baba .................... | H04N 5/2357 |
| | | | 348/228.1 |

OTHER PUBLICATIONS

Von Meier, A. et al., "Precision Micro-Synchrophasors fo Distribution Systems: A Summary of Applications," IEEE Transactions on Smart Grid, vol. 8, pp. 2926-2936, Nov. 2017.

(Continued)

*Primary Examiner* — Michael E Teitelbaum
(74) *Attorney, Agent, or Firm* — Hunton Andrews Kurth LLP

(57) ABSTRACT

An exemplary system, method, and computer-accessible medium for determining a property(ies) regarding an electrical grid(s) can be provided, which can include, for example, receiving a video(s) of the electrical grid(s), determining a flicker(s) in the electrical grid(s) based on the video(s), and determining the property(ies) based on the flicker(s). The flicker(s) can be a 120 Hertz flicker. The flicker(s) can be a flicker in a light(s) recorded in the video(s). A frequency and a phase of the flicker(s) can be determined.

28 Claims, 9 Drawing Sheets

(56) References Cited

OTHER PUBLICATIONS

Bianco, F. B. et al., In Proceedings of the 3rd ACM International Conference on Systems for Energy-Efficient Built Environments (BulldSys '16). ACM, New York, NY, USA, pp. 61-64. [From the Internet] DOI: https://doi.org/10.1145/2993422.2993570, 2016.

Sheinin, M. et al., "Computational Imaging on the Electric Grid," In Proceedings of the IEEE Computer Vision and Pattern Recognition Conference, pp. 2363-2372, 2017.

Pearson. K. "LIII. On lines and planes of closest fit to systems of points in space," Philosophical Magazine Series 6, 2(11), pp. 559-572 (1901).

* cited by examiner

SYSTEM, METHOD, AND COMPUTER-ACCESSIBLE MEDIUM FOR REMOTE SENSING OF THE ELECTRICAL DISTRIBUTION GRID WITH HYPERTEMPORAL IMAGING

CROSS-REFERENCE TO RELATED APPLICATION(S)

This application relates to and claims priority from U.S. Patent Application No. 62/736,061, filed on Sep. 25, 2018, the entire disclosure of which is incorporated herein by reference.

STATEMENT REGARDING FEDERALLY SPONSORED RESEARCH

This invention was made with government support under Grant No. DE-AR0000886, awarded by the Advanced Research Projects Agency-Energy. The government has certain rights in the invention.

FIELD OF THE DISCLOSURE

The present disclosure relates generally to electrical grid measurements, and more specifically, to exemplary embodiments of an exemplary system, method, and computer-accessible medium for remote sensing of the electrical distribution grid with hypertemporal imaging.

BACKGROUND INFORMATION

Urban electric power grids present unique challenges for energy providers who must assure the steady, reliable, functioning of equipment at multiple spatial scales. Current Systems that monitor the health of the power grid deploy a network of Phase Measurement Units ("PMUs") to assess the coherence and phase drift of the United States of America's 60 Hz alternating current (e.g., 50 Hz in Europe and other world locations) at multiple points within the network. PMU measurements of the instantaneous grid phase, frequency, and amplitude can be used to predict outages, and to maintain reliable power generation as intermittent sources come on and off. To date, PMU deployments have been at the transmission level.

Monitoring the grid's behavior and health is important as distributed generation systems become widespread and the grid is no longer used exclusively to distribute power, as it was designed to do, but also to harvest power.

Additionally, utility electric power systems have not been designed to accommodate active generation and storage at the distribution level. As a result, there are major issues and obstacles to an orderly transition to using and integrating distributed power resources with the grid.

Over 40 states in the United States of America allow for some type of "net metering", and the Public Utility Regulatory Policy Act of 1978 ("PURPA") mandates that electric utilities purchase the excess electricity generated by renewable energy systems. As customers are operating power generating devices (e.g., solar panels, wind turbines, fuel cells), voltage variations caused by feeding that power back into the grid can damage appliances, and even damage the grid infrastructure. Utilities attempt to prevent such events and ensure that power from distributed sources meets grid standards. A micro-PMU ("uPMU") can measure the status of the distribution grid at a single point. However, uPMUs are still at the experimental stage, and although they are accurate, uPMUs are costly and cumbersome to deploy. (See, e.g., Reference 1).

Thus, it may be beneficial to provide exemplary systems, methods, and computer-accessible medium for remote sensing of the electrical distribution grid with hypertemporal imaging that can overcome or address at least some of the deficiencies described herein above.

SUMMARY OF EXEMPLARY EMBODIMENTS

An exemplary system, method, and computer-accessible medium for determining a property(ies) regarding an electrical grid(s) can be provided, which can include, for example, receiving a video(s) (e.g., of lights connected to the electrical grid(s), determining a flicker(s) in the electrical grid(s) (e.g., of the connected lights) based on the video(s), and determining the property(ies) of the electrical grid(s) based on the flicker(s). The flicker(s) can be a flicker in a light(s) recorded in the video(s). The flicker(s) can have a frequency double that of the distribution grid and can be a 120 Hertz flicker. A frequency, a phase, or an amplitude of the flicker(s) can be determined.

In some exemplary embodiments of the present disclosure, the phase can be a phase shift. The property(ies) can be a change in electrical load of a circuit(s), and the change in the electrical load can be determined based on the phase shift. The video(s) can be received from a camera(s). The camera can be configured to generate the video(s) at about 4 Hz. The camera(s) can be a high speed camera configure to sample at at least about 100 Hz. The flicker(s) can be down converted, for example to about ¼ Hz. The flicker(s) can be determined by applying an image registration procedure to the video(s).

According to certain exemplary embodiments of the present disclosure, the flicker(s) can be determined by applying a flux extraction procedure to the video(s). The flicker(s) can be determined by determining one or more time series for the video(s) and generating one or more denoised time series by applying a Fourier transform low-pass filter to the one or more time series. A Principal Component Analysis can be applied to the one or more denoised time series. Intensities in the video(s) that are faster than about 2 Hz can be removed, for example, by de-biasing the intensities using a low-pass filter, normalizing the intensities using the low-pass filter, or smoothing the intensities using the low-pass filter.

These and other objects, features, and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features, and advantages of the present disclosure will become apparent from the following detailed description taken in conjunction with the accompanying Figures showing illustrative embodiments of the present disclosure, in which.

Figures 1A, 1B:
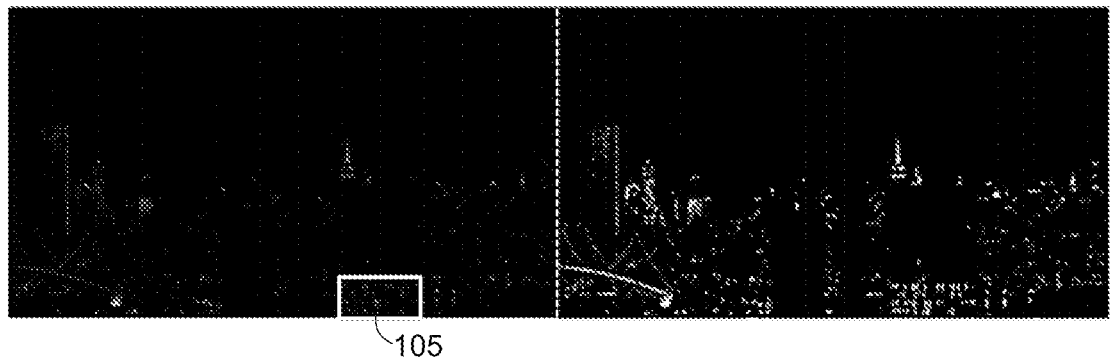
FIGS. 1A and 1B are images of a city skyline and its discrete light sources obtained using the exemplary system, method, and computer-accessible medium according to an exemplary embodiment of the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

The 60 Hz mains frequency can be reflected in a 120 Hz flickering of certain widespread lighting technologies (e.g., primarily incandescent, halogen, and fluorescent, etc.). Persistent and synoptic visible imaging of flickering city lights can be used to analyze and measure the grid frequency and phase of this flicker for many individual sources simultaneously, and in near-real time.

An exemplary apparatus, method, and computer-accessible medium can be used to monitor the 120 Hz flicker and detect phase shifts that can indicate changes of load in the local circuit (e.g., appliances turning on and off). (See, e.g., Reference 2). Exemplary equipment can include a camera imaging at about 4 Hz (e.g., within about plus or minus 10% of 4 Hz), for example, at the limit of its stability. Images through a liquid crystal shutter operating close to the target 120 Hz can down-convert the flicker to a slower beat frequency, for example, ¼ Hz (e.g., within about plus or minus 10% of ¼ Hz). The choices of cameras and lenses can be limited in this exemplary set-up by the limited availability of suitable shutters, which tend to have a small physical diameter. (See, e.g., Reference 2). The flicker can also be measured directly using a high-speed imaging camera (e.g., for the purpose of distinguishing lighting technologies through their temporal behavior) sampling at over about 100 Hz (e.g., over within about plus or minus 10% of 100 Hz or over about several hundreds of Hertz). However, such instruments can be costly, can have a small field of view, and may not be able to record for more than a few minutes at a time given the volume of data generated. (See, e.g., Reference 3).

The exemplary system, method, and computer-accessible medium, according to an exemplary embodiment of the present disclosure, can be used to detect the flicker of urban lights by utilizing a video camera (e.g., at a standard frame rate), which can be at the PAL-standard 23.976 frames-per-second ("fps"). Differences in the frame rate, or its harmonics, from the frequency of the underlying oscillation can be used to observe a harmonic of the difference, which can produce an approximately 0.12 Hz signal (e.g., for the PAL standard) from the mains-generated flicker. That signal can be sampled at approximately 200 frames per cycle, and can facilitate the measurement of variations in the observed frequency, and grid frequency, and its phase with high precision. In contrast, the prior shutter method produced only 8 samples per beat cycle.

An exemplary analysis of the described signal from multiple sources in the image can determine two characteristics of the grid previously available only with expensive in situ uPMUs: (i) stability of the grid frequency and phase with time at multiple spatial scales and (ii) network distribution structure of the grid at the building scale.

The exemplary system, method, and computer-accessible medium, according to an exemplary embodiment of the present disclosure, can be used to gather and analyze a video. Alternatively, video can be gathered using an exemplary imaging apparatus (e.g., a video camera), which can be analyzed at a later point in time using the exemplary system, method, and computer-accessible medium.

The exemplary system, method, and computer-accessible medium was utilized on a video collected in 120-second runs every 10 minutes from a camera atop a building in Brooklyn, N.Y., imaging a Manhattan skyline. (See e.g., images shown in FIGS. 1A and 1B). The approximately 2880 frames in each run were converted to gray scale, and light sources were extracted by thresholding the pixel luminosity. Some recognizable landmarks are the Manhattan Bridge and Hudson Yards on the left-hand side, the Empire State Building near the center-right, and the Chrysler Building in the right-hand side. Hundreds of buildings displaying over 1000 viable light sources are visible in the scene. FIG. 1A shows a stack generated by co-adding images from the exemplary video stream. The set of windows enclosed in box 105 belong to a single foreground building. They display high signal-to-noise flicker (e.g., the approximately 0.12 Hz signal described above), which is shown in the graph of FIG. 2. FIG. 1B shows the sources selected for analysis by applying a high-pass filter on the gray-scale stack and selecting pixels above a threshold value. The normalized time-dependent intensities of two foreground sources are shown in the graph of FIG. 2; signals with a high signal-to-noise ratio were at the expected approximately 0.12 Hz.

Exemplary Source Selection.

Since not all light technologies flicker at twice the mains frequency (e.g., LEDs), the first procedure in the exemplary analysis can be to identify which time series show the appropriate signal frequency of approximately 0.12 Hz. In order to achieve this, a Fourier transform low-pass filter can be applied to each time series to reduce noise (see e.g., graph shown in FIG. 2) and then a Principle Component Analysis ("PCA") can be applied to these denoised time series. (See e.g., Reference 4).

Figure 2:
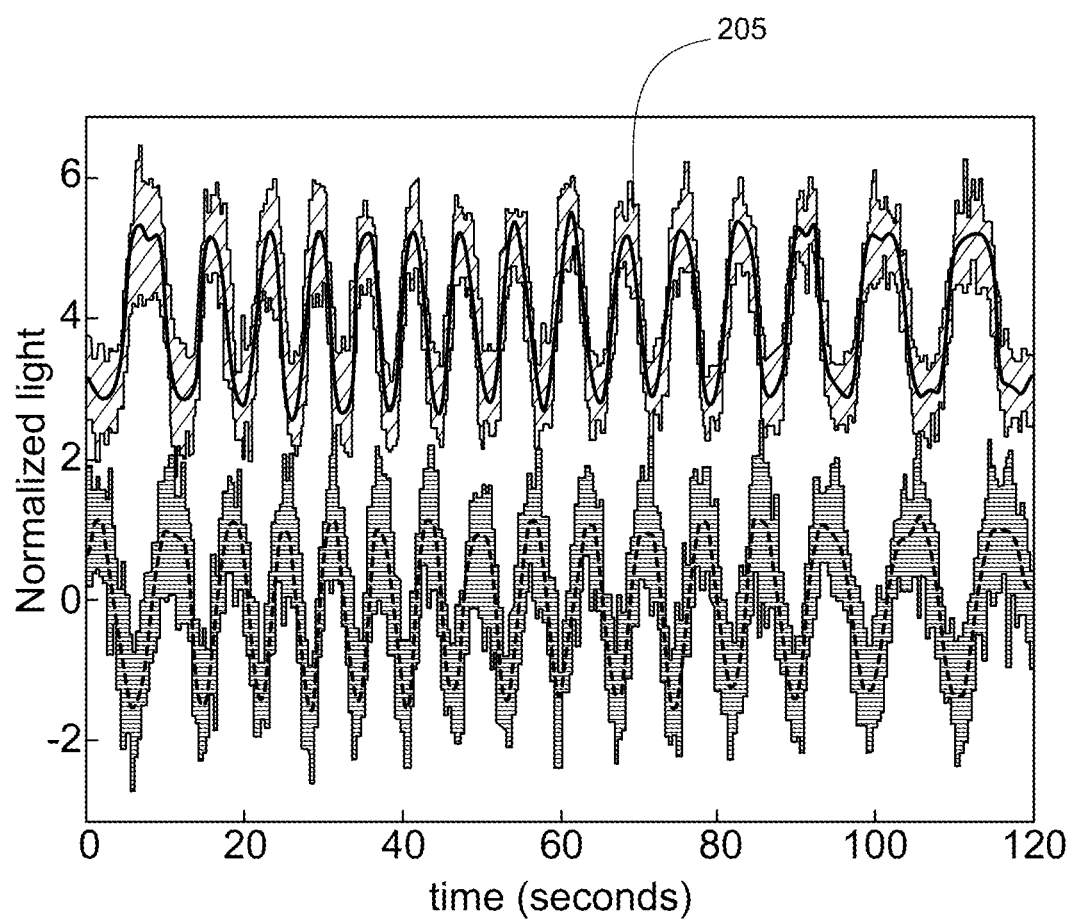
FIG. 2 is an exemplary graph illustrating the time-dependent time intensity from two foreground sources (e.g., lights) according to an exemplary embodiment of the present disclosure.

FIG. 2 shows an exemplary graph of an exemplary time-dependent intensity from two foreground sources 205 and 210. Intensities from the raw images have been de-biased, normalized, and smoothed with a low-pass filter that can be used to remove frequencies faster than approximately 2 Hz (e.g., within about plus or minus 10% of 2 Hz). While the two sources can be nearly 180° out of phase, they display synchronous variation in frequency, which can correspond to about 0.05 Hz in grid frequency.

Figure 3:
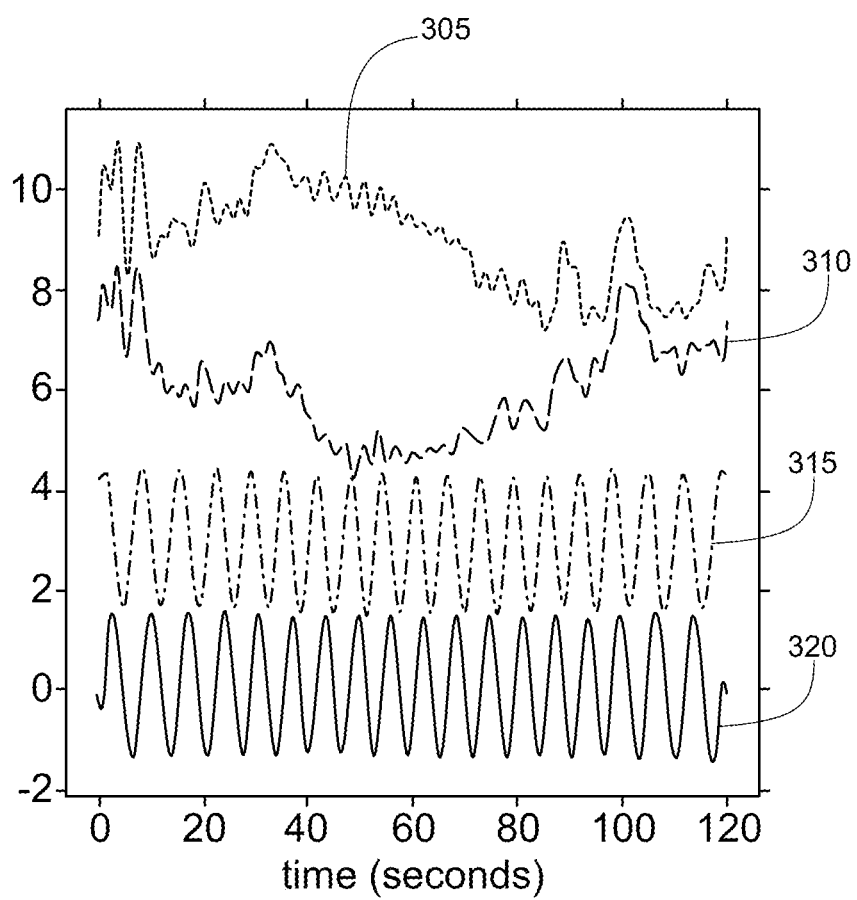
FIG. 3 is an exemplary graph illustrating principal components of the time series of the sources extracted from a video according to an exemplary embodiment of the present disclosure.

The two expected quadrature phases of the approximately 0.12 Hz signal can be present in the first and second Principle Components (e.g., PC 305 and PC 310), with the components sorted by their decreasing ability to explain the variance in the exemplary data set, as shown in a graph of FIG. 3. For example, FIG. 3 shows an exemplary graph illustrating principal components PC 305, PC 310, PC 315, and PC 320 of the time series of sources extracted from a video according to an exemplary embodiment of the present disclosure. Sources flickering at the expected mains frequency can be selected by their large projections onto the plane (e.g., PC 305 and PC 310). The PC components are shown with PC 305, which can explain most of the variance in the dataset, at the bottom, and the following three (e.g., PC 3210, PC 315, and PC 320) at ay-axis offsets of 3 units. PC 305 and PC 310 are the quadrature of the signal induced by the mains frequency. PC 305 and PC 310 show slower trends due to, for example, instrumental signatures, changes of illumination in the scene, and frequencies induced by registration shifts, etc.

Figure 4:
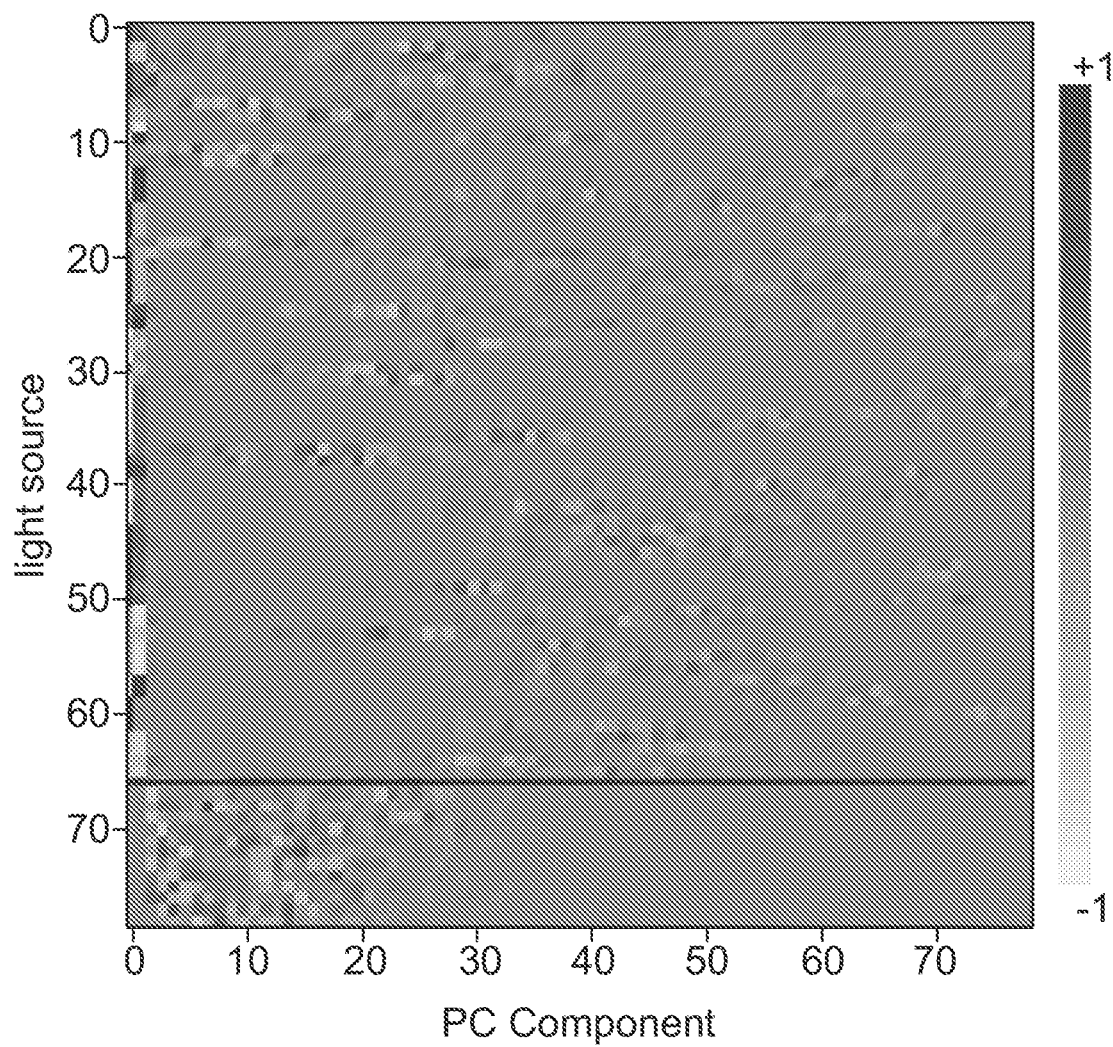
FIG. 4 is an exemplary diagram illustrating principal component coefficients of a set of 81 sources extracted from a 120 seconds video according to an exemplary embodiment of the present disclosure.

FIG. 4 shows a diagram illustrating the PC coefficients for a set of sources in a foreground building (e.g., indicated by box 105 from FIG. 1A) and from the Empire State Building LEDs that do not flicker. PC coefficients of a set of 81 sources were extracted from a single 120 second run. Source number runs vertically and PC number increases horizontally; the variations indicate the normalized PC coefficient, ranging from −1 to +1. The top 66 sources flicker and thus have large admixtures of PC 305 and PC 310. The bottom 15 sources do not flicker and thus have small admixtures of PC 305 and PC 310.

Exemplary Grid Frequency and Phase Measurements

The exemplary light sources that have been identified as flickering can be used to measure variations in that frequency as well as phase shifts. Thus, for example, (i) the frequency of each source can be measured, (ii) the average frequency of the lights in the scene (e.g., city-scale frequency behavior) can be determined, and (iii) the phase of the flicker of each source can be determined.

Exemplary City-Scale Frequency Behavior

Figure 5:
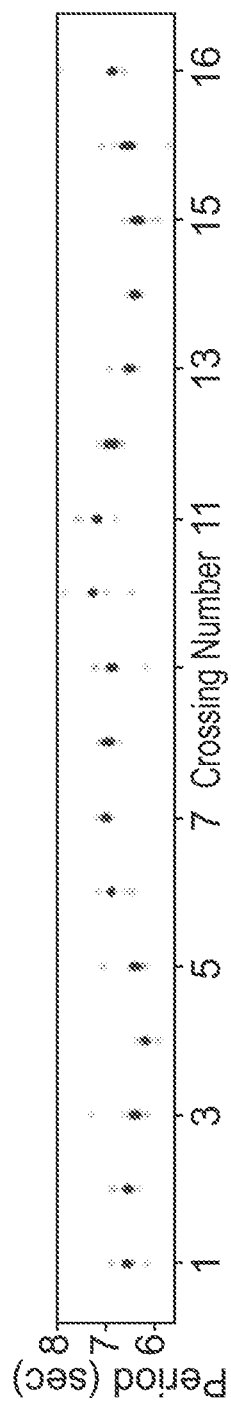
FIG. 5 is an exemplary diagram illustrating signal periods extracted from the crossing times in six high signal-to-noise ratio flickering sources according to an exemplary embodiment of the present disclosure.

FIG. 5 shows an exemplary diagram illustrating signal periods extracted from the crossing times in six high signal-to-noise ratio flickering sources according to an exemplary embodiment of the present disclosure. The frequency (e.g., beat periods) for 6 high signal-to-noise ratio foreground flickering sources during a single run were measured from the crossings; the time separation between crossings defines the period for a cycle. Changes in period, or in frequency, are seen in all sources with small variations between them. These sources are observed to vary coherently (e.g., simultaneously) with <1.2 second variations in a single run, corresponding to variations in the signal frequency of approximately 0.04 Hz over 120 seconds. These frequency variation measurements are consistent with each other and are consistent with the expected grid frequency variations: a 0.02 Hz change in the 60 Hz frequency of the mains can lead to such a change in the observed flicker. These can be seen in all observed flickering lights in a defined section of the urban grid, but not seen in the time behavior of other sources, thus ruling out an instrumental signature. Fluctuation in the grid's frequency can be observed with the same variation measured by uPMUs.

As shown in FIG. 5, the period of each source is shown in gray scale and the mean and median periods in black. Changes in period, or equivalently in frequency, can be seen in all sources with small variations between them.

Exemplary Measuring Frequency of Each Source

Figure 6:
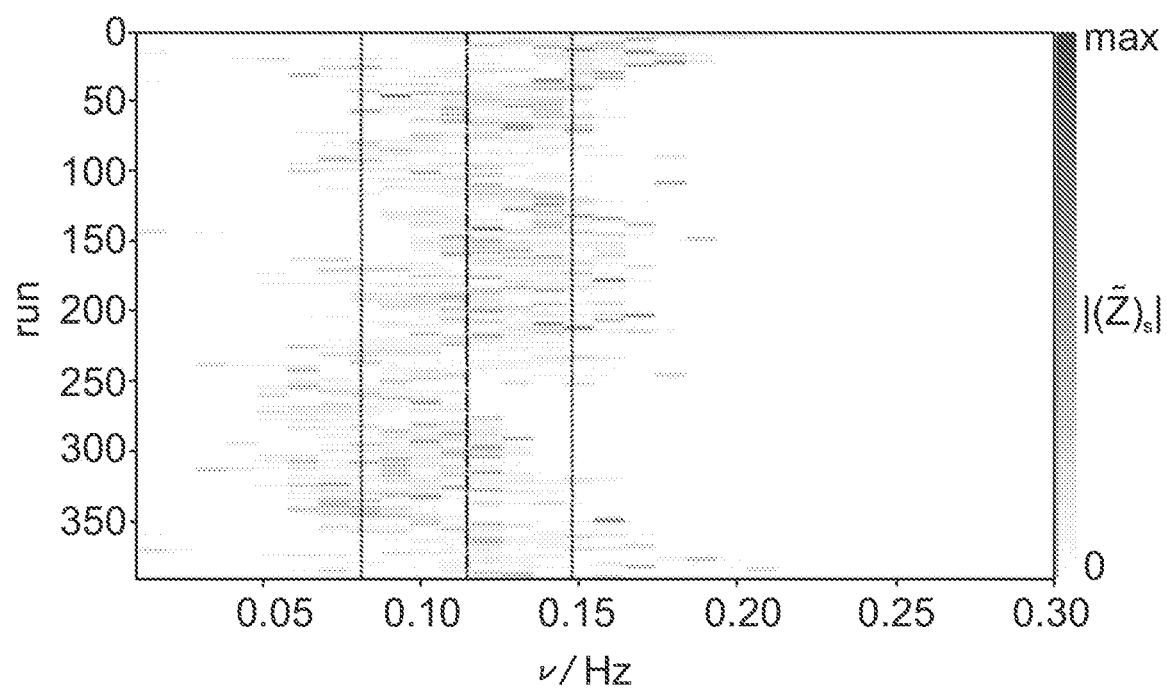
FIG. 6 is an exemplary graph illustrating the power spectrum analysis of a single flickering source according to an exemplary embodiment of the present disclosure.

The average flicker, and grid, frequency over a run can be measured, for example, by analyzing the power spectrum of the signal (e.g., square of the real part of the Fourier transform). One such exemplary analysis is shown for a single laboratory light source (e.g., an incandescent bulb connected to the mains) over 65 hours and the results are shown in FIG. 6. Modulations of the frequency of about 0.04 Hz are observed.

FIG. 6 shows an exemplary graph illustrating the power spectrum analysis of a single flickering source according to an exemplary embodiment of the present disclosure. In particular, FIG. 6 illustrates how the power spectrum analysis of a single flickering source can be performed, and that the power at each frequency can be proportional to the corresponding cell. Time runs along the y-axis: each 120 second duration video is separated by 10 minutes from the next. In total this exemplary experiment was run for 66 hours. The mean signal frequency of approximately 0.12 Hz and its standard deviation are indicated by vertical lines. The frequency variation within approximately 0.04 Hz in the flickering can correspond to changes in the 60 Hz mains frequency of 0.02 Hz.

For example, the frequency and phase of each source can be measured directly by identifying the "crossings": the times where its normalized signal crosses through zero (e.g., the mean of the normalized signal). These crossings are found for each cycle, or half cycle) of the low-pass filtered time series.

Exemplary Phases

The phase of each source can be measured in three exemplary ways. First, directly as the offset of its crossings from that of an arbitrary reference source. Second, as the dot product of the time series of two sources as follows. In the presence of continuously varying frequencies, the "accumulated phase" of the flicker can be defined, for example, as $\Phi(t)=\int_0^T dt \omega(t)$, where $\omega(t)$ can be the instantaneous angular frequency. Then the asymptotic difference in phase of two sinusoidal time series, $\Delta(\Phi)$, can be $\Delta(\Phi(T))=\int_0^T d\Phi(t)\sin(\Phi(t)-\tfrac{1}{2}\Psi)\sin(\Phi(t)+\tfrac{1}{2}\Psi)$, and $$\lim_{t\to\infty} \Delta(\Phi) = \cos(\Psi) + O\left(\frac{1}{\Phi}\right),$$

where $\Psi$ can be the phase offset. Thus, the phase difference can be derived as the arccosine of the normalized dot product of two time series. Thus, for example:

$$\Delta(\Psi(T)) = \arccos \frac{I_1 \cdot I_2(T)}{\sqrt{I_1 \cdot I_1(T) I_2 \cdot I_2(T)}},$$

the redefined dot product $I_1 \cdot I_2(T)=\int_0^T \omega dt I_1(t) I_2(t)$.

It can also be measured from the ratio of the coefficients of PC 305 and PC 310. These exemplary methods can lead to consistent measurements of the phase, and the phases of different sources appear to cluster into A/B/C configuration.

This can show that a subset of the grid can be observed whose behavior can be determined by the structure of the distribution network itself.

Figure 7:
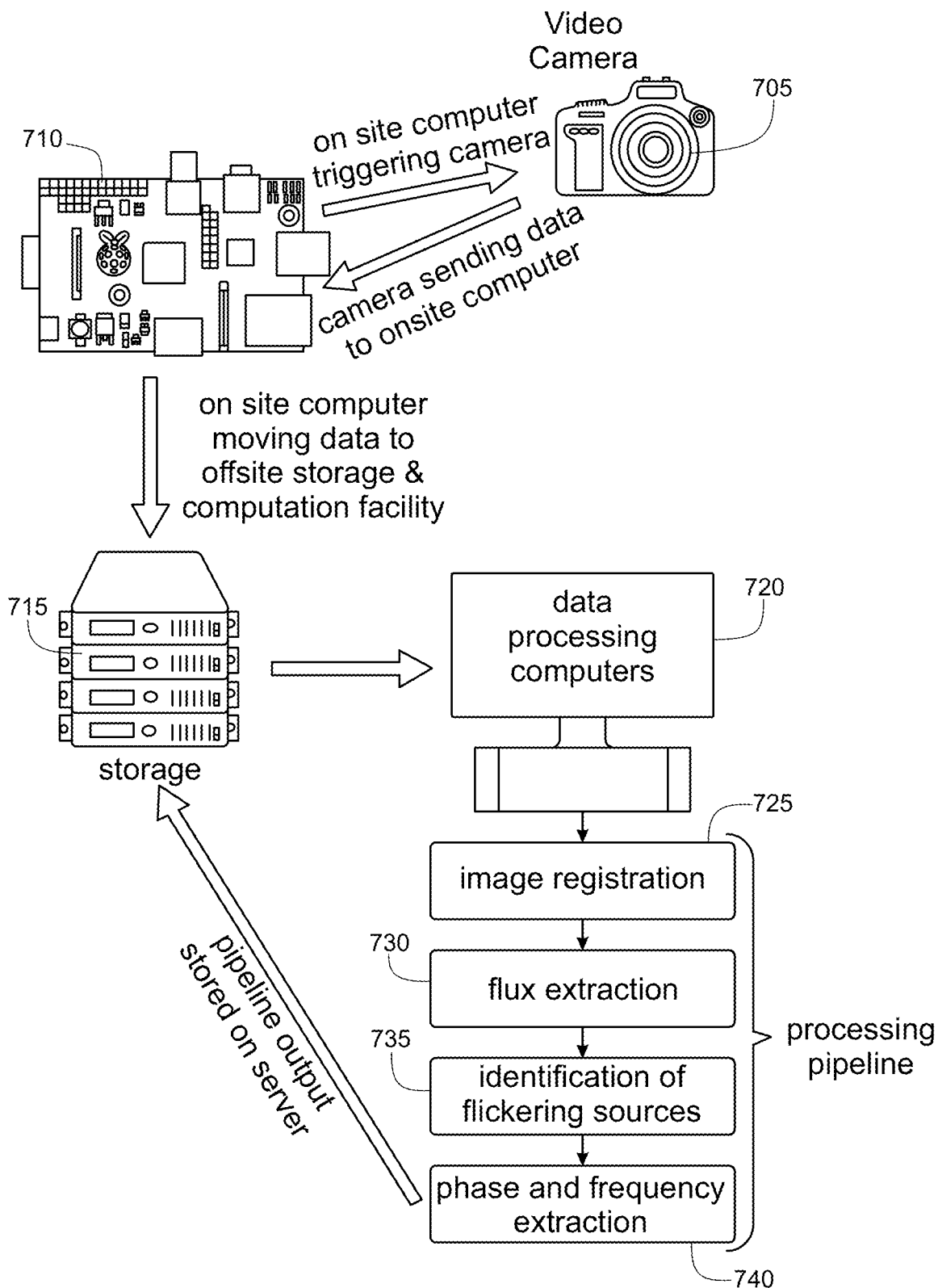
FIG. 7 is an exemplary schematic diagram of a system for determining a property regarding an electrical grid according to an exemplary embodiment of the present disclosure.

FIG. 7 shows an exemplary schematic diagram of a system for determining a property regarding an electrical grid according to an exemplary embodiment of the present disclosure. For example, a computing arrangement 710 can trigger a video camera 705 to record video of a subject area (e.g., a portion of an environment to be monitored). Computing arrangement 710 can be one or more computers that can be connected to camera 705 using any suitable connection medium (e.g., wired or wireless), and can be located near camera 705 or at a location that is separate from camera 705. For example, computing arrangement 710 can be located at a central location, and can communicate with multiple cameras. Each camera 705 can have a network connection, and can receive remote commands from computing arrangement 710 to start and/or end the recording of the video. Additional commands can include the amount of time to record video, as well as various other suitable video parameters (e.g., frames per second, video quality, etc.).

Camera 705 can record video for a particular duration, and then transmit the recorded video back to computing arrangement 710 to be stored in a storage arrangement 715, and/or camera 705 can transmit the recorded video directly to storage arrangement 715. Alternatively or in addition, computing arrangement 710 can access a live video feed from camera 710, and computer 710 can record the live video feed to be stored in storage arrangement 715. Storage arrangement 715 can be coupled to computing arrangement 710 and can be located at the same location as computing arrangement 710. Alternatively or in addition, storage arrangement 715 can be located at a remote location from computing arrangement 710, and computing arrangement 710 can communicate with storage arrangement 715 using a network connection (e.g., wired or wireless). Alternatively or in addition, storage arrangement 715 can be a cloud storage arrangement, which can be accessed by computing arrangement 710 over the Internet.

The video captured by video camera 710 can be stored on storage arrangement 715 to be processed by one or more data processing computers 720. Data processing computer(s) 720 can immediately process the video after it is stored in storage arrangement 715, or data processing computer(s) 720 can process the video at a later time, which can be set by a user. For example, data processing computer(s) 720 can perform batch processing of the video at preset times, or after a particular amount of video has been stored (e.g., a particular number of seconds or minutes of video that can be sufficient to process).

In order to process the video, data processing computer(s) 720 can perform an image registration procedure 725 and/or a flux extraction procedure 730. An identification of the flickering sources can be performed at procedure 735, and a phase and frequency extraction can be performed at procedure 740. After the video has been processed by processing computers 720, the processed video can be stored in storage arrangement 715, or another storage arrangement.

Figure 8:
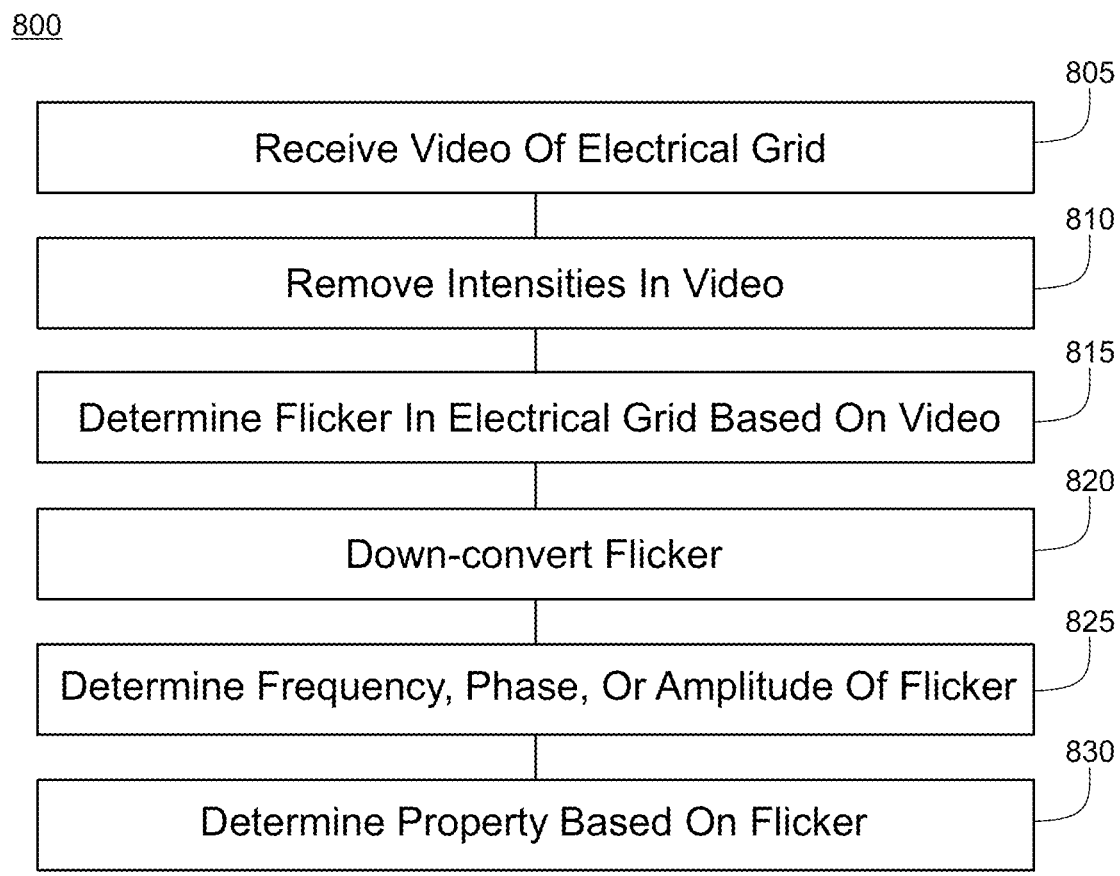
FIG. 8 is an exemplary flow diagram of an exemplary method for determining a property regarding an electrical grid according to an exemplary embodiment of the present disclosure.

FIG. 8 shows an exemplary flow diagram of an exemplary method 800 for determining a property regarding at least one electrical grid according to an exemplary embodiment of the present disclosure. For example, at procedure 805, a video of an electrical grid can be received. At procedure 810, some intensities in the video can be removed. At procedure 815, a flicker in the electrical grid can be determined based on the video. At procedure 820, the flicker can be down-converted. At procedure 825, a frequency, a phase, or an amplitude of the flicker can be determined. At procedure 830, the property can be determined based on the flicker.

Figure 9:
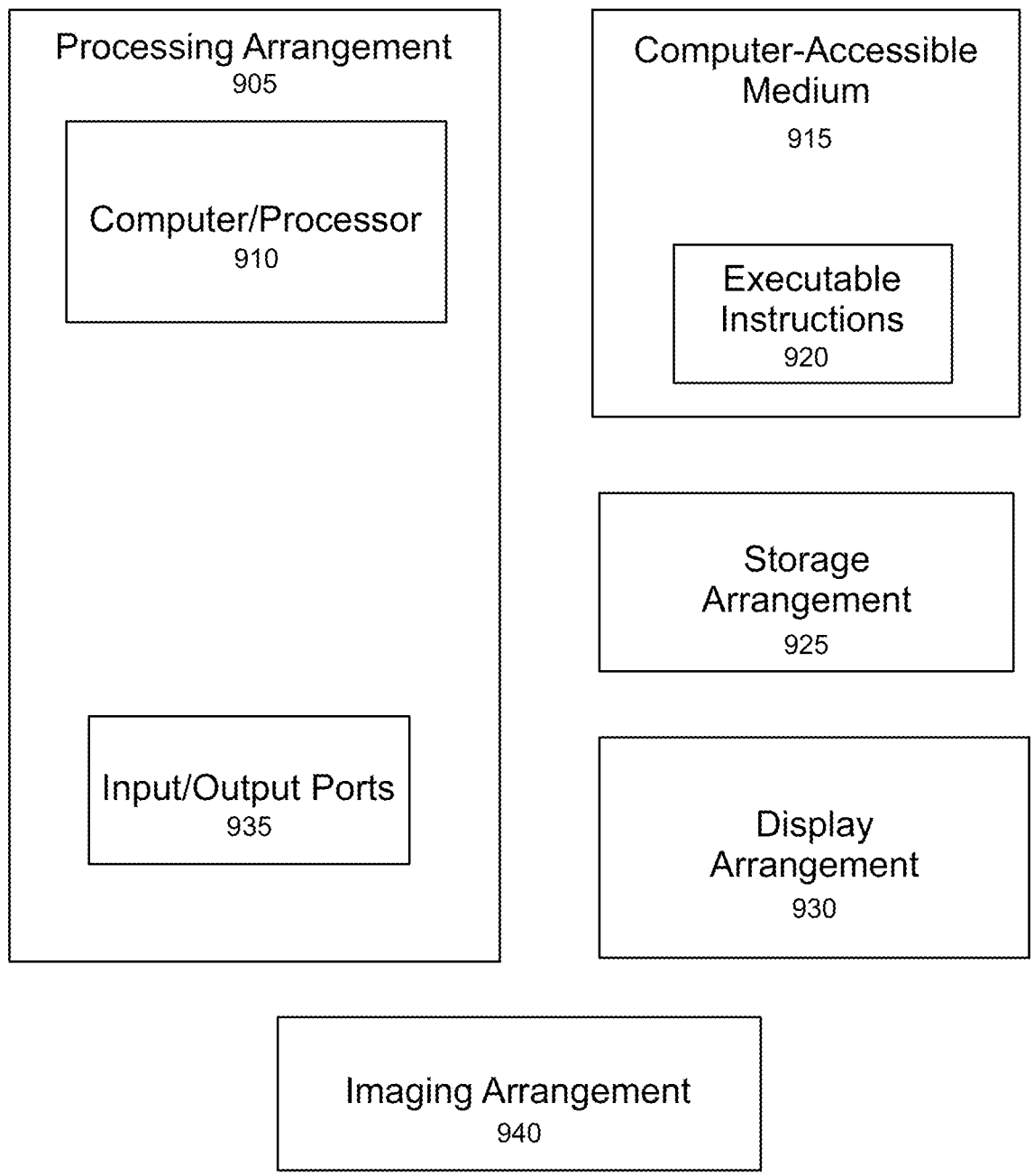
FIG. 9 is an illustration of an exemplary block diagram of an exemplary system in accordance with certain exemplary embodiments of the present disclosure.

FIG. 9 shows a block diagram of an exemplary embodiment of a system according to the present disclosure. For example, exemplary procedures in accordance with the present disclosure described herein can be performed by a processing arrangement and/or a computing arrangement (e.g., computer hardware arrangement) 905. Such processing/computing arrangement 905 can be, for example, entirely or a part of or include, but not limited to, a computer/processor 910 that can include, for example, one or more microprocessors, and use instructions stored on a computer-accessible medium (e.g., RAM, ROM, hard drive, or other storage device).

As shown in FIG. 9, for example a computer-accessible medium 915 (e.g., as described herein above, a storage device such as a hard disk, floppy disk, memory stick, CD-ROM, RAM, ROM, etc., or a collection thereof) can be provided (e.g., in communication with the processing arrangement 905). The computer-accessible medium 915 can contain executable instructions 920 thereon. In addition or alternatively, a storage arrangement 925 can be provided separately from the computer-accessible medium 915, which can provide the instructions to the processing arrangement 905 so as to configure the processing arrangement to execute certain exemplary procedures, processes, and methods, as described herein above, for example.

Further, the exemplary processing arrangement 905 can be provided with or include an input/output ports 935, which can include, for example a wired network, a wireless network, the internet, an intranet, a data collection probe, a sensor, etc. As shown in FIG. 9, the exemplary processing arrangement 905 can be in communication with an exemplary display arrangement 930, which, according to certain exemplary embodiments of the present disclosure, can be a touch-screen configured for inputting information to the processing arrangement in addition to outputting information from the processing arrangement, for example. Further, the exemplary display arrangement 930 and/or a storage arrangement 925 can be used to display and/or store data in a user-accessible format and/or user-readable format.

Additionally, an exemplary imaging arrangement 940 can be provided and or included, which can be used to generate images or video used by the exemplary system, method, and computer-accessible medium. For example, exemplary imaging arrangement 940 can include a standard, or custom-designed, video camera, which can be used to generate one or more video of the electrical grid being analyzed. Exemplary imaging apparatus 940 can be connected to, or coupled with, storage arrangement 925, using any suitable wired or wireless communication medium, to transfer the exemplary video to storage arrangement 925.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, for example, data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entireties.
1. A. von Meier et al., IEEE Transactions on Smart Grid, vol. 8, pp. 2926-2936 (2017)
2. F. B. Bianco, S. E. Koonin, C. Mydlarz, and M. S. Sharma. In Proceedings of the 3rd ACM International Conference on Systems for Energy-Efficient Built Environments (BuildSys '16). ACM, New York, N.Y., USA, 61-64. DOI: https://doi.org/10.1145/2993422.2993570 (2016)
3. M. Sheinin, Y. Y. Schechner and K. N. Kutulakos, In Proceedings of the IEEE Computer Vision and Pattern Recognition Conference (2017)
4. K. Pearson. LIII. On lines and planes of closest fit to systems of points in space. Philosophical Magazine Series 6, 2(11):559-572 (1901).

What is claimed is:

1. A non-transitory computer-accessible medium having stored thereon computer-executable instructions for determining at least one property regarding at least one electrical grid, wherein, when a computer arrangement executes the instructions, the computer arrangement is configured to perform procedures comprising:
receiving at least one video of the at least one electrical grid;
determining at least one flicker of each of a plurality flickering sources in the at least one electrical grid based on the at least one video;
determining a relative phase shift of the at least one flicker of at least one of the plurality of the flickering sources in the at least one video, wherein the relative phase shift is a phase shift of at least at least one of:
 the at least one flicker of a first flickering source at a first time relative to the at least one flicker of the first flickering source a second time which is earlier than the first time; or
 the at least one flicker of the first flickering source relative to the at least one flicker of the second flickering source; and
determining the at least one property based on the phase shift of the at least one flicker of each of the plurality of the flickering sources, wherein the at least one property includes a change in an electrical load of at least one circuit in the at least one electrical grid.

2. The computer-accessible medium of claim 1, wherein the at least one flicker is a 120 Hertz flicker.

3. The computer-accessible medium of claim 1, wherein the at least one video is of at least one light connected to the at least one electrical grid.

4. The computer-accessible medium of claim 3, wherein the at least one flicker is a flicker in the at least one light recorded in the at least one video.

5. The computer-accessible medium of claim 1, wherein the computer arrangement is further configured to determine at least one of (i) a frequency of the at least one flicker or (ii) an amplitude of the at least one flicker.

6. The computer-accessible medium of claim 1, wherein the computer arrangement is configured to receive the at least one video from at least one camera.

7. The computer-accessible medium of claim 6, wherein the at least one camera is configured to generate the at least one video at about 4 Hz.

8. The computer-accessible medium of claim 6, wherein the at least one camera is a high speed camera configure to sample at about 100 Hz or more.

9. The computer-accessible medium of claim 1, wherein the computer arrangement is further configured to down-convert the at least one flicker.

10. The computer-accessible medium of claim 9, wherein the computer arrangement is configured to down-convert the at least one flicker to about ¼ Hz.

11. The computer-accessible medium of claim 1, wherein the computer arrangement is configured to determine the at least one flicker by applying an image registration procedure to the at least one video.

12. The computer-accessible medium of claim 1, wherein the computer arrangement is configured to determine the at least one flicker by applying a flux extraction procedure to the at least one video.

13. The computer-accessible medium of claim 1, wherein the computer arrangement is configured to determine the at least one flicker by:
determining at least one time series for the at least one video; and
generating at least one denoised time series by applying a Fourier transform low-pass filter to the at least one time series.

14. The computer-accessible medium of claim 13, wherein the computer arrangement is further configured to apply a Principal Component Analysis to the at least one denoised time series.

15. The computer-accessible medium of claim 1, wherein the computer arrangement is further configure to remove intensities in the at least one video that are faster than about 2 Hz.

16. The computer-accessible medium of claim 15, wherein the computer arrangement is configured to remove the intensities by at least one of (i) de-biasing the intensities using a low-pass filter, (ii) normalizing the intensities using the low-pass filter, or (iii) smoothing the intensities using the low-pass filter.

17. A method for determining at least one property regarding at least one electrical grid, comprising:
receiving at least one video of the at least one electrical grid;
determining at least one flicker of each of a plurality of flickering sources in the at least one electrical grid based on the at least one video;
determining a relative phase shift of the at least one flicker of each of the plurality of flickering sources in the at least one video, wherein the relative phase shift is a phase shift of at least at least one of:
 the at least one flicker of a first flickering source at a first time relative to the at least one flicker of the first flickering source a second time which is earlier than the first time; or
 the at least one flicker of the first flickering source relative to the at least one flicker of the second flickering source; and
using a computer arrangement, determining the at least one property based on the phase shift of the at least one flicker of each of the plurality of the flickering sources, wherein the at least one property includes a change in an electrical load of at least one circuit in the at least one electrical grid.

18. A system for determining at least one property regarding at least one electrical grid, comprising:
a computer hardware arrangement configured to:
receive at least one video of the at least one electrical grid;
determine at least one flicker of each of a plurality of flickering sources in the at least one electrical grid based on the at least one video;
determine a relative phase shift of the at least one flicker of each of the plurality of flickering sources in the at least one video, wherein the relative phase shift is a phase shift of at least at least one of:
the at least one flicker of a first flickering source at a first time relative to the at least one flicker of the first flickering source a second time which is earlier than the first time; or
the at least one flicker of the first flickering source relative to the at least one flicker of the second flickering source; and
determine the at least one property based on the phase shift of the at least one flicker of each of the plurality of the flickering sources, wherein the at least one property includes a change in an electrical load of at least one circuit in the at least one electrical grid.

19. The computer-accessible medium of claim 5, wherein the computer arrangement is further configured to determine a network distribution structure of the at least one electrical grid based on the phase shift of at least two flickers of each of the plurality of flickering sources.

20. The computer-accessible medium of claim 5, wherein the computer arrangement is further configured to determine a network distribution structure of the at least one electrical grid based on the change of the electrical load of the at least one circuit in one or more of the plurality of flickering sources.

21. The computer-accessible medium of claim 5, wherein the computer arrangement is further configured to determine the change in the electrical load on a particular source from the plurality of sources based on the phase shift of the at least one flicker of at least one of the plurality of flickering sources.

22. The computer-accessible medium of claim 5, wherein the computer arrangement is further configured to determine if a particular one of plurality of flickering sources is connected to at least one electrical grid.

23. The computer-accessible medium of claim 5, wherein the computer arrangement is configured to determine the phase shift of the at least one flicker of each of the plurality of flickering sources from a single video of the at least one video.

24. The computer-accessible medium of claim 5, wherein the computer arrangement is further configured to determine the phase shift of the at least one flicker of each of the plurality of flickering sources based on a dot product of the time series of at least two of the plurality of sources.

25. The computer-accessible medium of claim 5, wherein the computer arrangement is further configured to determine a change in period among at least two of the plurality of flickering sources, and determine the at least one property based on the change in period.

26. The computer-accessible medium of claim 1, wherein the first relative phase shift indicates addition of a new load to a circuit or an instability in a grid.

27. The computer-accessible medium of claim 1, wherein the second relative phase shift maps out a structure of a grid.

28. The computer-accessible medium of claim 1, wherein the structure of the grid is a phase of the grid.

* * * * *